United States Patent
Lee

(10) Patent No.: US 8,120,017 B2
(45) Date of Patent: Feb. 21, 2012

(54) ORGANIC LIGHT EMITTING DISPLAY AND METHOD OF MANUFACTURING THE SAME

(75) Inventor: Keun Soo Lee, Seongnam-si (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 0 days.

(21) Appl. No.: 11/506,698

(22) Filed: Aug. 18, 2006

(65) Prior Publication Data

US 2007/0045617 A1 Mar. 1, 2007

(30) Foreign Application Priority Data

Aug. 30, 2005 (KR) .................. 10-2005-0080277

(51) Int. Cl.
*H01L 23/48* (2006.01)

(52) U.S. Cl. ............. 257/40; 257/59; 257/72; 257/749; 257/753; 257/763; 257/E51.019; 257/E51.02

(58) Field of Classification Search .............. 257/40, 257/59, 72, 749, 753, 763, E51.019, E51.02; 349/152

See application file for complete search history.

(56) References Cited

U.S. PATENT DOCUMENTS

| | | | |
|---|---|---|---|
| 6,599,767 B1 | 7/2003 | Li | |
| 7,224,118 B2* | 5/2007 | Yamazaki et al. | 313/506 |
| 2001/0002703 A1* | 6/2001 | Koyama | 257/40 |
| 2001/0023661 A1* | 9/2001 | Hiroki et al. | 118/300 |
| 2003/0089991 A1* | 5/2003 | Yamazaki et al. | 257/759 |
| 2004/0125313 A1* | 7/2004 | Lim | 349/152 |
| 2005/0110023 A1 | 5/2005 | Lee et al. | |
| 2005/0250308 A1* | 11/2005 | Yamaguchi et al. | 438/618 |
| 2005/0285823 A1* | 12/2005 | Kimura et al. | 345/76 |
| 2006/0139254 A1* | 6/2006 | Hayakawa et al. | 345/76 |

FOREIGN PATENT DOCUMENTS

| | | |
|---|---|---|
| EP | 1 531 495 A2 | 5/2005 |
| KR | 10-2000-0033530 A | 6/2000 |

OTHER PUBLICATIONS

Kim, Investigations of electrical properties in silica/indium tin oxide two layer film for effective electromagnetic shielding, J. Am. Ceram; Soc. 87, 2213-2217, 2004.*
Notice of Allowance for Korean Patent Application No. 10-2005-0033530 A issued on Oct. 23, 2007.
European Search Report dated Sep. 10, 2010 received in priority European Application No. 06254527.2.

* cited by examiner

*Primary Examiner* — Minchul Yang
(74) *Attorney, Agent, or Firm* — Knobbe Martens Olson & Bear LLP

(57) ABSTRACT

An organic light emitting display (OLED) and a method of manufacturing the OLED is disclosed. The OLED, which has a transparent metal layer substantially preventing an oxide layer from forming on a pad metal, and a method of manufacturing the OLED are disclosed. The OLED includes a substrate, a display unit formed on the substrate including gate and source/drain electrodes, and a pad unit formed on the substrate configured to transmit electrical signals to the display unit. The pad unit includes a wiring line terminal in which a transparent metal layer is formed in a predetermined shape and a predetermined region.

16 Claims, 3 Drawing Sheets

ORGANIC LIGHT EMITTING DISPLAY AND METHOD OF MANUFACTURING THE SAME

CROSS-REFERENCE TO RELATED APPLICATIONS

This application claims the benefit of Korean Patent Application No. 2005-80277, filed on Aug. 30, 2005, in the Korean Intellectual Property Office, the disclosure of which is incorporated herein by reference.

BACKGROUND OF THE INVENTION

1. Field of the Invention

The present invention relates to an organic light emitting display (OLED) and a method of manufacturing the OLED, and more particularly, to an OLED in which a transparent metal layer is formed on a metal layer to function as a wiring line terminal. The transparent metal layer in formed is such a way that an oxide layer is prevented from being generated on the wiring line terminal.

2. Description of the Related Technology

Various flat panel displays have been developed so as to have less weight and bulk than that of a Cathode Ray Tube (CRT). The class of flat panel displays include liquid crystal displays (LCDs), field emission displays (FEDs), plasma display panels (PDPs), organic light emitting displays, etc. An organic light emitting display presents an image using organic light emitting diodes that generate light from the-recombination of electrons and holes. Such an organic light emitting display has advantages in that it has a high response speed, and operates in a low power consumption. Flat panel displays often incorporate thin film transistors (TFT) which control the operation of the organic light emitting diodes.

FIG. 1 is a cross-sectional view illustrating the structure of a conventional OLED.

Referring to FIG. 1, in the conventional OLED, a display unit (a) and a pad unit (b) are formed on a substrate 100.

An activation layer 112 having source/drain regions 110 and a channel region 111 is formed in the display unit (a).

A gate insulating layer 113 is formed on the substrate 100 covering at least the activation layer 112. A gate electrode 114 is formed on the gate insulating layer 113 over the channel region 111.

An interlayer insulating layer 115 is formed on the top surface of the substrate 100 covering the gate electrode 114. Source/drain contact holes are formed in the interlayer insulating layer 115 to expose the source/drain regions 110.

Source/drain electrodes 116 are formed in the display unit (a) region on the interlayer insulating layer 115 and are connected to the source/drain regions 110, respectively, through the source/drain contact holes. A wiring line terminal 117 is formed in the pad unit b on the interlayer insulating layer 115. The wiring line terminal 117 is electrically connected to one of the source/drain electrodes 116 of the display unit (a) to transmit data signals to the source/drain electrode 116.

A planarization insulating layer 118 is formed on the top surface of the substrate 100 covering the wiring line terminal 117. A via hole 119 that exposes one of the source/drain electrodes 116 and a pad contact hole 120 that exposes the wiring line terminal 117 are formed in the planarization insulating layer 118.

A first transparent metal layer 121, an Ag layer 122, and a second transparent metal layer 123 are sequentially formed on the planarization insulating layer 118. The first transparent metal layer 121, the Ag layer 122, and the second transparent metal layer 123 are patterned so that a pixel electrode 124 is formed on the planarization insulating layer 118 of the display unit. Similarly, a pad electrode 125 connected to the wiring line terminal 117 through the pad contact hole 120 is formed on the planarization insulating layer 118 of the pad unit (b). Therefore, the pixel electrode 124 is formed by laminating the first transparent metal layer 121, the Ag layer 122, and the second transparent metal layer 123. The pad electrode 125 is formed by sequentially laminating a third transparent metal layer 126, an Ag layer 127, and a fourth transparent metal layer 128. When in operation, the light emitted from an emission layer (not shown) formed on the pixel electrode 121 is reflected from the Ag layer 122 that is a reflection layer so that it is possible to realize a top surface emission OLED that emits light through the substrate 100. On the other hand, the first through fourth transparent metal layers 121, 123, 126, and 128 are formed from an optically transmissive material such as indium tin oxide (ITO) or indium zinc oxide (IZO).

The pad electrode 125 is exposed so that it may be bonded to an external module. Electrical signals from the external module are input thereto and the electrode is therefore vulnerable to external contaminating agents such as moisture or oxygen. When a metal having a rough surface is used as the wiring line terminal 117, and the third transparent metal layer 126 is formed on the wiring line terminal 117 with a thickness of about 50 Å, the third transparent metal layer 126 becomes too thin in certain areas. In such circumstances, the surface of the third transparent metal layer 126 adjacent to the Ag layer 127 is not sufficiently planar to prevent voids at the interface. Because of the voids, during subsequent processing, corrosive agents can gain access to the Ag layer 127. As a result, the Ag layer 127 may corrode in such a way that, for example, its volume may increase causing wiring defects to occur.

SUMMARY OF CERTAIN INVENTIVE ASPECTS

Accordingly, it is an object of certain embodiments to provide an organic light emitting display (OLED) in which a pad electrode is removed to prevent an Ag layer from being corroded, wherein a transparent electrode layer is formed on a metal layer so that the transparent electrode layer is used as a wiring line terminal. With such a scheme an oxide layer is prevented from growing on the wiring line terminal exposed to the outside.

One embodiment is an organic light emitting display, including a substrate, a display unit formed on the substrate, the display unit including gate and source/drain electrodes, and a pad unit formed on the substrate. The pad unit is configured to transmit electrical signals to the display unit, and the pad unit includes a wiring line terminal including a transparent metal layer formed on a metal terminal. A predetermined region of the wiring line terminal is exposed to the environment, and the region has a predetermined shape.

Another embodiment is an organic light emitting display including a pixel unit including a plurality of data lines, a plurality of scan lines, and a plurality of pixels formed in regions defined by the plurality of data lines and the plurality of scan lines. The display also includes a data driver configured to transmit data signals to the plurality of data lines, a scan driver configured to transmit scan signals to the plurality of scan lines, and a pad unit configured to supply power to the data driver and the scan driver, where the pad unit includes a wiring line terminal. The wiring line terminal includes a transparent metal layer formed on a metal terminal, a predetermined region of the wiring line terminal is exposed to the environment, and the region has a predetermined shape.

Another embodiment is a method of manufacturing an organic light emitting display including a display unit positioned on a substrate, the display unit including gate and source/drain electrodes, and the display further including a pad unit configured to transmit electrical signals to the display unit. The method includes forming a pad unit, where forming the pad unit includes forming a metal terminal, covering the metal terminal with a transparent metal layer, and covering the metal terminal with a interlayer insulating layer. The method also includes forming a wiring line terminal, where forming the wiring line terminal includes removing a portion of the interlayer insulating layer from a predetermined region of the pad unit.

Another embodiment is a wiring line terminal for an organic light emitting including a transparent metal layer formed on a metal terminal, where a predetermined region of the wiring line terminal is exposed to the environment, and the region has a predetermined shape.

BRIEF DESCRIPTION OF THE DRAWINGS

These and/or other objects and advantages of certain embodiments will be more readily appreciated from the following description of certain embodiments, taken in conjunction with the accompanying drawings of which.

DETAILED DESCRIPTION OF CERTAIN EMBODIMENTS

Figure 1:
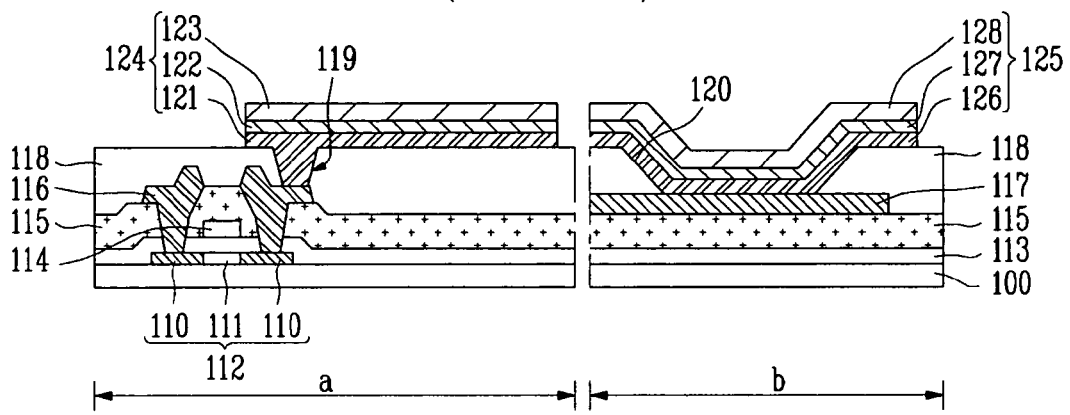
FIG. 1 is a cross-sectional view illustrating an example of a conventional organic light emitting display (OLED)
Figure 2:
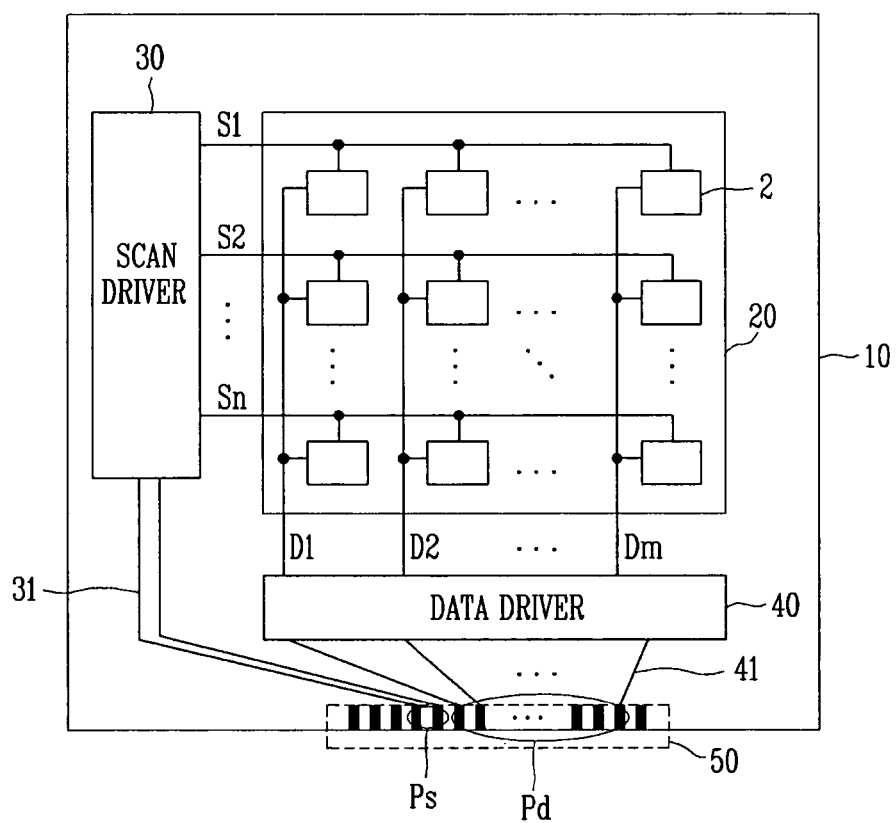
FIG. 2 is a block diagram illustrating an example of an OLED according to an embodiment.

FIG. 2 is a plan view illustrating an example of an organic light emitting display (OLED).

The OLED includes a pixel unit 20, a scan driver 30, a data driver 40, and a pad unit 50 on a substrate 10.

The pixel unit 20 includes a plurality of scan lines S1, S2, . . . , and Sn arranged in a row direction and a plurality of data lines D1, D2, . . . , and Dm arranged in a column direction. A plurality of pixels 2 are formed in the regions defined by the scan lines S1, S1, . . . , and Sn and the data lines D1, D2, . . . , and Dm.

The scan driver 30 is adjacent to one side of the pixel unit 20 and is electrically connected to a first pad Ps of the pad unit 50 through a scan supply line 31. The scan driver 30 receives signals from the first pad Ps through the scan supply line 31 and sequentially supply scan signals to the plurality of scan lines S1, S2, . . . , and Sn according to the received signals.

The data driver 40 may be manufactured in the form of a chip to be mounted on the substrate 10 and is electrically connected to a second pad Pd of the pad unit 50. The data driver 40 transmits data signals to the plurality of data lines D1, D2, . . . , and Dm.

The pad unit 50 supplies a driving power source to the scan driver 30 through the scan supply line 31 and supplies a driving power source to the data driver 40 through a data supply line 41. The data supply line 41 includes a wiring line terminal (not shown). The wiring line terminal can be formed by laminating a transparent metal layer (not shown) on a metal terminal (not shown). Subsequently, a predetermined region of the wiring line terminal is exposed so that the exposed wiring line terminal can be subsequently bonded to an external chip on glass (COG), a structure in which a driving IC chip is directly mounted on the substrate 10.

The pixels 2 are controlled by the scan signals supplied to the plurality of scan lines S1, S2, . . . , and Sn and display images corresponding to the data signals supplied to the plurality of data lines D1, D2, . . . , and Dm.

The above description with reference to FIG. 2 provides an example of an OLED which may utilize the inventive aspects described herein. However, embodiments of these inventive aspects can be practiced in various OLED's both similar to and not similar to that described with reference to FIG. 2.

Figure 3:
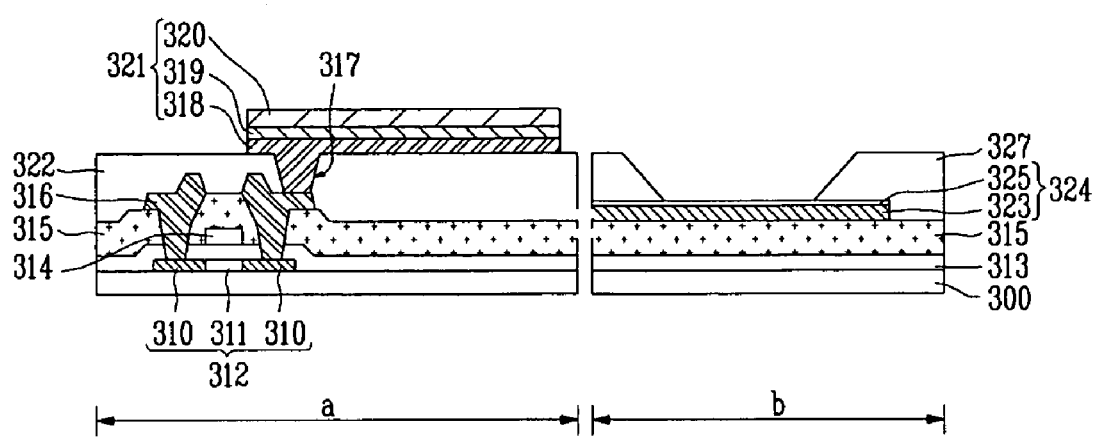
FIG. 3 is a cross-sectional view illustrating an example of an OLED according to an embodiment.

FIG. 3 illustrates an example of an OLED according to some embodiments.

In this OLED, a display unit (a) comprising an activation layer 312 having source/drain regions 310 and a channel region 311, a gate insulating layer 313, a gate electrode 314, an interlayer insulating layer 315, source/drain electrodes 316, a planarization insulating layer 322, a via hole 317, a first transparent metal layer 318, an Ag layer 319, and a second transparent metal layer 320 formed on a substrate 300. The first transparent metal layer 318, the Ag layer 319, and the second transparent metal layer 320 are part of a pixel electrode 321. The OLED pad unit (b) illustrated in FIG. 3 comprises the interlayer insulating layer 315, a wiring line terminal 324, and a protective layer 327 formed on the substrate 300.

Figure 4A:
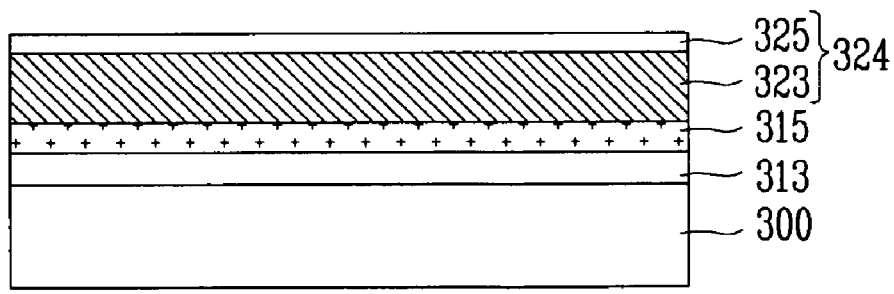
FIGS. 4A to 4D illustrate an example of processes of manufacturing a wiring line terminal included in the OLED of FIGS. 2 and 3.

A process for forming the pad unit b of FIG. 3 is described with reference to FIGS. 4A to 4D. As shown in FIG. 4A, the gate insulating layer 313 and the interlayer insulating layer 315 are formed on the substrate 300. The substrate 300 may comprise, for example, glass, SUS, or plastic. Other materials may also be used to form the substrate 300. The interlayer insulating layer 315 may be formed of $SiO_2$ or SiNx, although other materials may also be used.

The wiring line terminal 324 is configured to be bonded to the COG, which is an external module formed on the interlayer insulating layer 315. In some embodiments, the wiring line terminal 324 can be simultaneously formed with and can be formed of the same materials as other layers, such as, for example, the source/drain electrodes 316 of the display unit a. In some embodiments, the wiring line terminal 324 may comprise a transparent metal layer 325 and a metal terminal 323. The transparent metal layer 325 protects the metal terminal 323 in such a way that prevents an oxide from growing on the metal terminal 323. Such an oxide may otherwise grow during, for example, subsequent UV or plasma exposure, resulting in poor conductivity of the metal terminal 323. In some embodiments, the wiring line terminal 324 comprises titanium and/or aluminum layers with a thickness of about 500 to about 1,000 Å. Some embodiments use materials and thicknesses suitable for power efficiency. In some embodiments, the transparent metal layer 325 may comprise indium tin oxide (ITO) and/or indium zinc oxide (IZO)

Figure 4B:
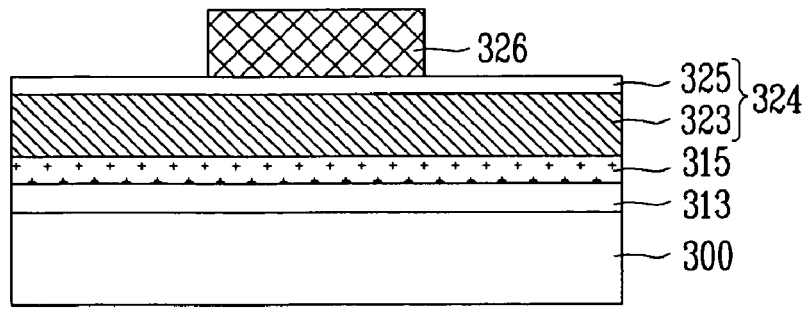
Figure 4C:
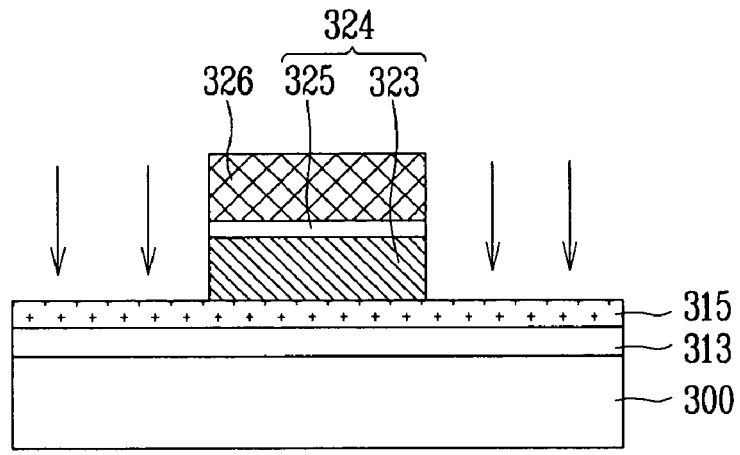

As shown in FIG. 4B, a photosensitive layer 326 is applied to a region on the wiring line terminal 324. In some embodiments, the photosensitive layer 326 comprises a photosensitive polymer compound that reacts to light of a specific wavelength range. Ultraviolet (UV) light is irradiated onto the photosensitive layer 326 and to the exposed portion of the wiring line terminal 324, as shown in FIG. 4C.

In a subsequent process, the wiring line terminal 324 is etched using the photosensitive layer 326 as an etching mask. The photosensitive layer 326 is subsequently removed. In some embodiments, the source/drain electrodes 316 of the display unit a are also patterned with the wiring line terminal 324.

Figure 4D:
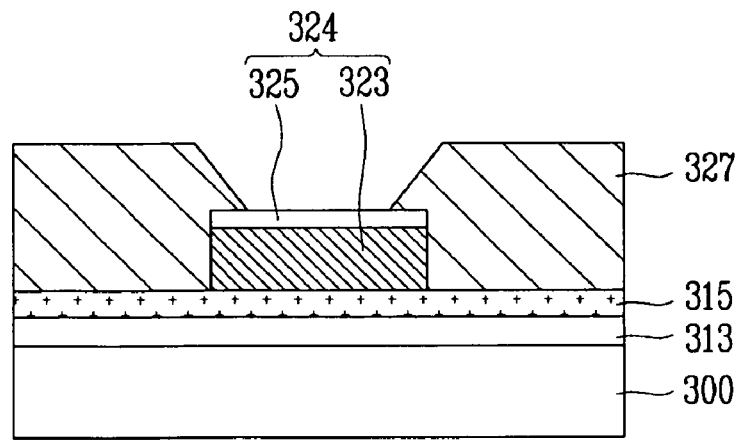

As shown in FIG. 4D, the protective layer 327 is formed on the substrate 300 with an opening corresponding to the transparent metal layer 325. With the metal terminal 323 covered by the transparent metal layer 325 and the remainder of the device covered by the protective layer 327, A UV or plasma exposure, for example, an oxygen plasma process can be performed without substantial damage to the device. In some embodiments, the protective layer 327 is formed of the same material as the planarization insulating layer 322 of the display unit a. In some embodiments the protective layer comprises acryl.

Although a few embodiments of the present invention have been shown and described, it would be appreciated by those skilled in the art that changes might be made in these embodiments without departing from the principles and spirit of the invention.

What is claimed is:

1. An organic light emitting display, comprising:
    a substrate;
    a display unit formed on the substrate, the display unit comprising gate and source/drain electrodes, wherein the gate is spaced apart from the source/drain electrodes by an insulating layer; and
    a pad unit formed on the substrate, the pad unit configured to transmit electrical signals to the display unit, wherein the pad unit comprises:
        a portion of the insulating layer on the substrate;
        a wiring line terminal on the insulating layer, the wiring line terminal comprising a transparent conductive layer formed over an entire top surface of a metal terminal; and
        a protective layer comprising an organic material, wherein the protective layer has an opening, wherein a region of the transparent metal layer is exposed to the environment by the opening, and wherein the organic material of the protective layer directly contacts the metal terminal of the wiring line terminal.

2. The organic light emitting display as claimed in claim 1, wherein the transparent conductive layer comprises indium tin oxide (ITO) or indium zinc oxide (IZO).

3. The organic light emitting display as claimed in claim 1, wherein the metal terminal comprises first and second titanium layers and an aluminum layer, wherein the aluminum layer is positioned between the first and second titanium layers.

4. The organic light emitting display as claimed in claim 1, wherein the opening is configured to expose the region, and the protective layer comprises an insulating material.

5. The organic light emitting display as claimed in claim 4, wherein the insulating material comprises acryl.

6. The organic light emitting display as claimed in claim 1, wherein the transparent conductive layer is formed directly on the entire top surface of the metal terminal, and a portion of the transparent conductive layer is exposed through the opening.

7. An organic light emitting display comprising:
    a pixel unit comprising:
        a plurality of data lines;
        a plurality of scan lines; and
        a plurality of pixels formed in regions defined by the plurality of data lines and the plurality of scan lines;
    a data driver configured to transmit data signals to the plurality of data lines;
    a scan driver configured to transmit scan signals to the plurality of scan lines;
    a display unit formed on the substrate, the display unit comprising gate and source/drain electrodes, wherein the gate is spaced apart from the source/drain electrodes by an insulating layer; and
    a pad unit configured to supply power to the data driver and the scan driver, wherein the pad unit comprises:
        a portion of the insulating layer on the substrate;
        a wiring line terminal on the insulating layer, wherein the wiring line terminal comprises a transparent conductive layer formed over an entire top surface of a metal terminal; and
        a protective layer comprising an organic material, wherein the protective layer has an opening, wherein a region of the transparent conductive layer is exposed to the environment by the opening, and wherein the organic material of the protective layer directly contacts the metal terminal of the wiring line terminal.

8. The organic light emitting display as claimed in claim 7, wherein the transparent conductive layer comprises indium tin oxide (ITO) or indium zinc oxide (IZO).

9. The organic light emitting display as claimed in claim 7, wherein the metal terminal comprises first and second layers each comprising titanium, and third layer comprising aluminum, wherein the third layer is positioned between the first and second layers.

10. The organic light emitting display as claimed in claim 7, wherein the opening is configured to expose the region, and wherein the protective layer comprises an insulating material.

11. The organic light emitting display as claimed in claim 10, wherein the insulating material comprises acryl.

12. The organic light emitting display as claimed in claim 7, wherein the transparent conductive layer is formed directly on the entire top surface of the metal terminal, and a portion of the transparent conductive layer is exposed through the opening.

13. A wiring line terminal for an organic light emitting display, the display comprising gate and source/drain electrodes, wherein the gate is spaced apart from the source/drain electrodes by an insulating layer, and the wiring line terminal comprising a transparent conductive layer formed over an entire top surface of a metal terminal, wherein a portion of the transparent conductive layer opposite and substantially parallel to the substrate is covered by a protective layer comprising an organic material, the protective layer having an opening, and wherein a region of the wiring line terminal is exposed to the environment by the opening, and wherein the wiring line terminal is formed over a portion of the insulating layer on the substrate, and wherein the organic material of the protective layer directly contacts the metal terminal of the wiring line terminal.

14. The organic light emitting display as claimed in claim 13, wherein the transparent conductive layer comprises indium tin oxide (ITO) or indium zinc oxide (IZO).

15. The organic light emitting display as claimed in claim 13, wherein the metal terminal comprises first and second titanium layers and an aluminum layer, wherein the aluminum layer is positioned between the first and second titanium layers.

16. The organic light emitting display as claimed in claim 13, wherein the transparent conductive layer is formed directly on the entire top surface of the metal terminal, and a portion of the transparent conductive layer is exposed through the opening.

* * * * *